US007081323B2

(12) United States Patent
Eggleton et al.

(10) Patent No.: US 7,081,323 B2
(45) Date of Patent: Jul. 25, 2006

(54) METHOD OF MAKING GRATINGS AND PHASE MASKS FOR FIBER GRATING FABRICATION

(75) Inventors: Benjamin J. Eggleton, Summit, NJ (US); Misha Sumetsky, Bridgewater, NJ (US); Paul S. Westbrook, Chatham, NJ (US)

(73) Assignee: Fitel USA Corp, Norcross, GA (US)

( * ) Notice: Subject to any disclaimer, the term of this patent is extended or adjusted under 35 U.S.C. 154(b) by 213 days.

(21) Appl. No.: 10/701,585

(22) Filed: Nov. 5, 2003

(65) Prior Publication Data
US 2004/0106050 A1    Jun. 3, 2004

Related U.S. Application Data

(60) Provisional application No. 60/429,555, filed on Nov. 27, 2002.

(51) Int. Cl.
*G01F 9/00* (2006.01)

(52) U.S. Cl. ........................................................ 430/5

(58) Field of Classification Search .................... 430/5, 430/1
See application file for complete search history.

(56) References Cited

U.S. PATENT DOCUMENTS 6,618,174 B1 * 9/2003 Parker et al. .................. 359/15
6,866,969 B1 * 3/2005 Miyamae et al. .............. 430/5

* cited by examiner

Primary Examiner—S. Rosasco
(74) Attorney, Agent, or Firm—Polster, Lieder Woodruff & Lucchesi, L.C.

(57) ABSTRACT

In accordance with the invention, the fabrication of a grating phase mask is improved by providing a multiple-scan exposure which can provide an accumulated exposure that is effectively phase modulated or modulated rapidly in amplitude. Applicants have determined that exposure scans can be chosen so that each is modulated in amplitude and without modulation in phase, but the accumulated exposure of the multiple scans is modulated in phase and/or modulated in amplitude. The improved method can be used to make phase masks for fabrication of sophisticated fiber gratings such as superstructure gratings.

7 Claims, 1 Drawing Sheet

METHOD OF MAKING GRATINGS AND PHASE MASKS FOR FIBER GRATING FABRICATION

CROSS REFERENCE TO RELATED APPLICATIONS

This application claims the benefit of U.S. Provisional Application Ser. No. 60/429,555 filed by the present inventors on Nov. 27, 2002 and entitled "Method of Making Phase Masks For Fiber Grating Fabrication." Ser. No. 60/429,555 is incorporated herein by reference.

FIELD OF THE INVENTION

This invention relates to methods of making gratings and phase masks used in the fabrication of optical fiber gratings. In particular, it relates to a method of making gratings or phase masks using multiple passes of modulated lasers. It permits the fabrication of complex masks by amplitude modulated lasers.

BACKGROUND OF THE INVENTION

Methods of making optical fiber gratings have become increasingly important. As optical fiber communication systems have advanced to carry higher bit rate signals on a greater number of optical channels, they have required fiber gratings in increasing number and sophistication to direct, compensate, separate, join and process the optical channels.

Phase masks are very useful in the fabrication of optical fiber gratings. Gratings consist of a sequence of periodic or near-periodic perturbations in the index of refraction along a length of grating. These perturbations are advantageously formed by providing a length of fiber having a photosensitive core and exposing the core to laser light that varies in intensity along the fiber length. Variation in laser intensity produces a corresponding variation in the index of refraction along the core. An appropriate pattern of variation produces a grating.

While a sequence of closely spaced low intensity and high intensity regions can be produced by exposing the fiber through an amplitude (slit mask) or by exposing the fiber to an interference pattern of laser beams, such techniques require meticulous and time-consuming work to achieve desired results. It is particularly difficult to produce large numbers of sophisticated gratings by such techniques.

Rather than individually writing each grating, it is preferable to write a phase mask which, when exposed to laser light, will produce a desired pattern on the fiber. The phase mask need be written only once. With relatively simple controls it can be subsequently used to rapidly and reliably produce a large number of nearly identical gratings.

A phase mask is typically made by coating a transparent substrate with photoresist, scanning the photoresist with laser light in an appropriately modulated pattern, developing the photoresist, and etching the substrate.

Unfortunately it is difficult to make phase masks for fabricating a number of important gratings. Some gratings, such as superstructure gratings, require illumination wherein the exposure source is modulated in phase. While lasers used to expose the photoresist in making phase masks can be modulated in amplitude, it is very difficult to modulate them in phase. Other phase masks require very rapid modulation of exposure. While lasers can be modulated in amplitude, it is difficult to change the amplitude as rapidly as some designs require. Accordingly there is a need for an improved method of making phase masks.

SUMMARY OF THE INVENTION

In accordance with the invention, the fabrication of a grating or phase mask is improved by providing a multiple-scan exposure which can provide an accumulated exposure that is effectively phase modulated or modulated rapidly in amplitude. Applicants have determined that exposure scans can be chosen so that each is modulated in amplitude and without modulation in phase, but the accumulated exposure of the multiple scans is nonetheless modulated in phase and/or modulated in amplitude. The improved method can be used to make phase masks for fabrication of sophisticated fiber gratings such as superstructure gratings.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

DETAILED DESCRIPTION

Figure 1:
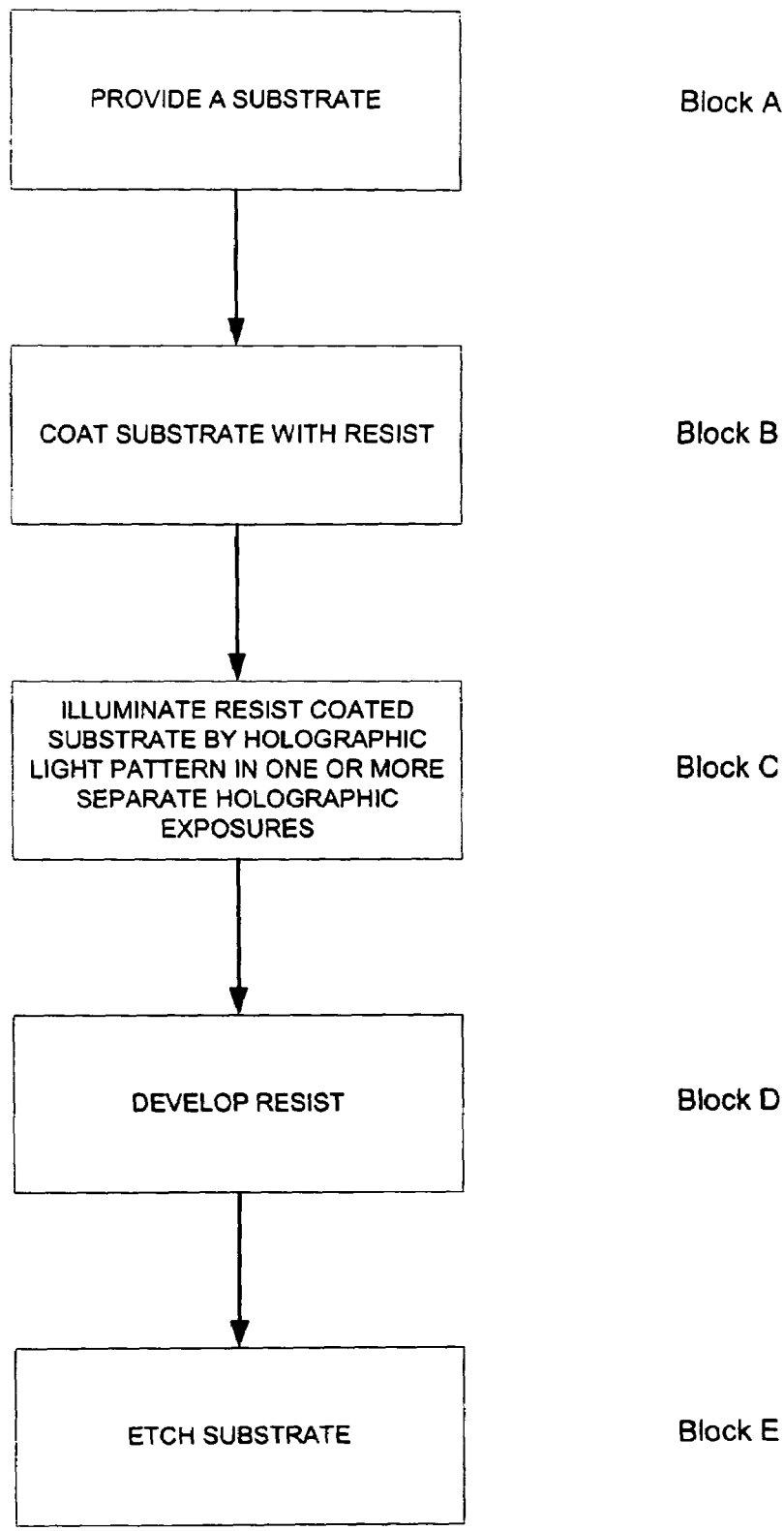
FIG. 1 is a block diagram showing the steps used to fabricate a phase mask.

According to the inventive method, a grating having an arbitrary amplitude and phase spatial distribution can be written into a mask or an optical medium by a sequence of multiple exposures. The mask can be used for the production of optical fiber gratings. The optical medium can be used as a grating.

Referring to the drawing, FIG. 1 is a schematic flow chart of the steps in making a phase mask. In Block A, a material is supplied to act as the substrate for ultimately receiving the grating mask pattern. Typically a quartz plate is used as a substrate.

In Block B, the substrate is prepared by coating with a photo sensitive coating (resist). The resist is selected to be suitable to the wavelength of the exposure light source used in the later method steps. The resist that is illuminated above some threshold intensity value, will later be removed in the etching process. Resist not illuminated, or illuminated below the threshold, will remain.

Block C represents multiple step holographic illumination of the resist. This step involves multiple successive illuminations of the mask according to illumination (dosage) equations disclosed herein.

In Block D, the resist is developed according to known methods of processing appropriate to the selected resist. Resist exhibits a strong non-linear sensitivity to the intensity of the illumination. The part of the resist, which has acquired a dose greater than the threshold, $D(x) > D_{th}$, is dissolved later during the development process. Here, the radiation dose absorbed by the resist is, $D(x) \sim I(x)$, where x is the coordinate along the mask.

And, finally in Block E, the substrate is etched where the resist has been removed, and not where the resist remains. The etched substrate is a completed mask suitable for the production of optical fiber gratings.

Referring again to the step of Block C, we now describe how multiple illumination steps can be used to provide the illumination required by the holographic illumination equation using amplitude modulated lasers. In holographic mask fabrication, the dose variation along the mask is created by the interference pattern of two coherent beams. A grating of arbitrary groove depth (strength), A(x), and phase, $\Phi(x)$, has the following spatial dependence:

$$D(x) = D_o + A(x)\sin^2\left(\frac{2\pi x}{\Lambda_0} + \Phi(x)\right) \quad (1)$$

where $\Lambda_0$ is the grating period, A(x), D(x), and $\Phi(x)$ are relatively slow functions of the coordinate x, and $D_0$ is substantially constant.

In the case when the function $\Phi(x)$ is constant or linear, equation (1) defines only the grating amplitude modulation. And, in the case where A(x) and D(x) are constants, eq. (1) a grating with phase modulation only. While the amplitude modulation of the grating can be performed by using the additional amplitude mask or, in general, by spatial variation of the laser beam power, introduction of the phase modulation is problematic. The latter, phase-only modulated phase masks, are important in writing a superstructure fiber grating. In order to have the small and constant zero-order intensity, which is important in fiber grating writing, the depth of the created grating should be constant and, therefore, D and A should not depend on x.

In order to create a grating having arbitrary amplitude and spatial phase distribution as defined by Eq. 1 we have determined that the dose distribution can be obtained by superposition of three achievable dose distributions. Consider, for example, the case when $0<\Phi(x)<\pi/4$. Then the dose (Eq. 1) may be obtained as the superposition of the following three illuminations:

$$D(x) = D_0 + A_0\left[\frac{1}{2} - \frac{1}{\sqrt{2}}\cos\left(2\Phi(x) - \frac{\pi}{4}\right)\right] + \quad (2i)$$

$$A_0\cos(2\Phi(x))\sin^2\left(\frac{2\pi x}{\Lambda_0}\right) + \quad (2ii)$$

$$A_0\cos\left(2\Phi(x) - \frac{\pi}{2}\right)\sin^2\left(\frac{2\pi x}{\Lambda_0} + \frac{\pi}{4}\right) \quad (2iii)$$

The first term in eq. 2 (2i) is positive for $$D_0 \geq \left[\frac{(\sqrt{2}-1)}{2}\right]A_0.$$

The second and the third terms in Eq.2 (2ii, 2iii) are positive for $0<\Phi(x)<\pi/4$. Thus the required dose distribution can be achieved in three exposure steps:

i. Single beam exposure with slow variation of the beam power
ii. Double beam exposure with slow variation of the beam power
iii. (a) Shifting the mask by ⅛ of the grating period (~125 nm) and (b) Double beam exposure with slow variation of the beam power.

The local period is the derivative of the phase in $D(x)>D_{th}$ (the resist threshold) over x. Therefore, the change in grating period associated with phase $\Phi(x)$ is:

$$\Delta\Lambda(x) = -\frac{\Lambda_0^2}{2\pi}\frac{d\Phi(x)}{dx} \quad (3)$$

The previously described three step exposure process does place some limitations on the phase $\Phi(x)$. These limitations can be overcome where necessary by a more generic five step exposure process. Specifically, the dose (Eq. 1) may be more generally obtained as the superposition of the following five illuminations:

$$D(x) = D_0 - A_0\left[\frac{3}{2} + \frac{1}{\sqrt{2}}\cos\left(2\Phi(x) - \frac{\pi}{4}\right)\right] + \quad (4i)$$

$$2A_0\cos^2(\Phi(x))\sin^2\left(\frac{2\pi x}{\Lambda_0}\right) + \quad (4ii)$$

$$2A_0\cos^2\left(\Phi(x) - \frac{\pi}{4}\right)\sin^2\left(\frac{2\pi x}{\Lambda_0} + \frac{\pi}{4}\right) + \quad (4iii)$$

$$A_0\sin^2\left(\frac{2\pi x}{\Lambda_0} - \frac{\pi}{2}\right) + \quad (4iv)$$

$$A_0\sin^2\left(\frac{2\pi x}{\Lambda_0} - \frac{\pi}{4}\right) \quad (4v)$$

The phase shifts $\pi/4$, $-\pi/4$ and $-\pi/2$ can be achieved by shifting the mask substrate with respect to the holographic pattern.

The first term in this expression is positive if $D_0>2.21A_0$. All other terms are positive. The disadvantage of this expansion, which assumes 5 steps in mask writing, is that the dose $D_0$ is relatively large. This may or may not affect the quality of the gratings, depending on the properties of the resist.

A similar method can be used to fabricate gratings in an optical medium. The method involves providing an optical medium comprising a photosensitive region and exposing the photosensitive region to a plurality of holographic illumination steps according to the expanded terms of an equation describing an optical grating (e.g. illumination steps corresponding to the three terms of Eq. 2 or the 5 terms of Eq. 4).

The invention may now be more clearly understood by consideration of the following specific examples:

1. Creation of Phase Superstructure Gratings

For the creation of phase superstructure gratings, the phase $\Phi(x)$ in eq. 1 has the form of:

$$\Phi(x) = \alpha[1 + \cos(2\pi x/P)] \quad (5)$$

where P is the period of superstructure. The periodic variation of intensity can be obtained by using the long-period amplitude mask. The corresponding grating period variation is:

$$\Delta\Lambda(x) = \frac{\alpha\Lambda_0^2}{P}\sin(2\pi x/P) \quad (6)$$

Condition of the positive sign of terms in eq. 2 gives $2\alpha<\pi/4$, or $\alpha<0.39$. For the superstructure period P=0.4 mm this defines the possible range of grating period variation up to ±1 nm.

2. Correction of the Small Grating Period Ripple

Putting P=2 cm in eq. 5 we can estimate the range of possible correction with use of the suggested technique equal to ±0.02 nm.

It is understood that the above-described embodiments are illustrative of only a few of the many possible specific embodiments which can represent applications of the invention. The multi-exposure method can be used for direct inscription of gratings into photosensitive cores of optical fibers or planar waveguides. Indeed it can be applied to the creation of arbitrary gratings in an optical medium of general nature. Thus numerous and varied other arrangements can be made by those skilled in the art without departing from the spirit and scope of the invention.

What is claimed is:

1. A method for fabricating a phase mask comprising the steps of:
    supplying a substrate;
    coating the substrate with resist;
    exposing the resist to a plurality of spatial holographic illumination steps according to the expanded terms of an equation describing an optical grating, the illumination steps comprising a single beam exposure, a double beam exposure through a mask and a double beam exposure with the mask shifted;
    developing the resist; and
    etching the substrate.

2. The method of claim 1 wherein the plurality of illumination steps produces an accumulated exposure that is modulated in phase and/or modulated in amplitude.

3. The method of fabricating a phase mask according to claim 2, wherein the three terms of the equation are:

$$D(x) = D_0 + A_0 \left[ \frac{1}{2} - \frac{1}{\sqrt{2}} \cos(2\Phi(x) - \frac{\pi}{4}) \right] +$$

$$A_0 \cos(2\Phi(x)) \sin^2\left(\frac{2\pi x}{\Lambda_0}\right) +$$

$$A_0 \cos(2\Phi(x) - \frac{\pi}{2}) \sin^2\left(\frac{2\pi x}{\Lambda_0} + \frac{\pi}{4}\right),$$

where D is the illumination dosage, A is the groove depth, $\lambda$ is the grating period, and $\Phi$ is the phase.

4. The method of fabricating a phase mask according to claim 1, wherein the resist is exposed to five holographic illuminations according to five expanded terms of an equation describing the optical grating.

5. The method of fabricating a phase mask according to claim 4, wherein the five terms of the equation are:

$$D(x) = D_0 - A_0 \left[ \frac{3}{2} + \frac{1}{\sqrt{2}} \cos(2\Phi(x) - \frac{\pi}{4}) \right] +$$

$$2A_0 \cos^2(\Phi(x)) \sin^2\left(\frac{2\pi x}{\Lambda_0}\right) +$$

$$2A_0 \cos^2(\Phi(x) - \frac{\pi}{4}) \sin^2\left(\frac{2\pi x}{\Lambda_0} + \frac{\pi}{4}\right) +$$

$$A_0 \sin^2\left(\frac{2\pi x}{\Lambda_0} - \frac{\pi}{2}\right) +$$

$$A_0 \sin^2\left(\frac{2\pi x}{\Lambda_0} - \frac{\pi}{4}\right),$$

where D is the illumination dosage, A is the groove depth, $\Lambda$ is the grating period, and $\Phi$ is the phase.

6. The method of claim 4 wherein the phase shifts $\pi/4, -\pi/4, -\pi/2$ are achieved by shifting the mask substrate with respect to the holographic pattern.

7. The method of fabricating a phase mask according to claim 1 wherein supplying the substrate comprises supplying a quartz substrate.

* * * * *